United States Patent [19]

Christopherson

[11] 4,194,135
[45] Mar. 18, 1980

[54] ELECTRONIC SIGNAL LEVEL TRANSLATING CIRCUITRY

[75] Inventor: Warren A. Christopherson, San Jose, Calif.

[73] Assignee: International Business Machines Corporation, Armonk, N.Y.

[21] Appl. No.: 921,144

[22] Filed: Jun. 30, 1978

[51] Int. Cl.$^2$ ............................................. H03K 5/00
[52] U.S. Cl. ................................... 307/260; 307/264; 307/296 R; 307/DIG. 1
[58] Field of Search ............... 307/260, 264, 296, 297, 307/310, DIG. 1

[56] References Cited
U.S. PATENT DOCUMENTS

| | | | |
|---|---|---|---|
| 3,518,449 | 6/1970 | Chung | 307/215 |
| 3,757,137 | 9/1973 | Ahmed | 307/362 |
| 3,879,576 | 4/1975 | Okada et al. | 178/7.3 S |
| 3,970,875 | 7/1976 | Leehan | 307/304 |
| 3,980,963 | 9/1976 | Doi | 307/310 X |

OTHER PUBLICATIONS

R. F. Althaus et al., "NIM Fast Logic Modules Utilizing MECL III Integrated Circuits" Nuclear Science Symposium, Nov. 3-5, 1971, pp. 520-525.
"MECL III Integrated Circuits Data Book" 3rd Edition, Motorola, Inc., Sep. 1973, pp. 1-7 and 1-8.

Primary Examiner—John Zazworsky
Attorney, Agent, or Firm—George E. Roush

[57] ABSTRACT

This circuitry translates a relatively large voltage bi-level logical signal to an inphase relatively low voltage bi-level signal for bistatic current-switching logical circuitry. A transistor is connected in the common base circuit arrangement for a first order of input-output circuit isolation. Substantially complete isolation is afforded by a reference tracking circuit which is arranged to track exactly for temperature, base-to-emitter voltage and process variations. This circuit provides a potential at the base of the transistor which is the sum of the emitter-to-base voltage drop and one half of the applied energizing potential. The proper base potential is effected by simple adjustment of the ratio of the value of the input resistor to the value of the load resistor. Many such circuits may be operated on a single semiconductor chip.

10 Claims, 3 Drawing Figures

ELECTRONIC SIGNAL LEVEL TRANSLATING CIRCUITRY

FIELD OF INVENTION

The invention relates to electronic logical signal interface circuitry, and it particularly pertains to logical signal level converting and isolating circuitry.

BACKGROUND

Logical signal receiving circuitry, logical level converting circuitry, and input-output circuit isolating circuitry have been well known for decades. As the art relating to the logic of information handling systems and logical circuitry therefore has advanced, the requirements for logical signal translating circuitry has become more and more exacting. The circuitry according to the invention is concerned with the translation of logical signal levels from a relatively wide voltage swing to a relatively small voltage swing for use in binary current-switch logical circuitry. It is also concerned with obtaining a high degree of isolation between the input circuit and the output circuit, together with maintaining a high degree of stability.

PRIOR ART

Prior art circuitry of interest in this connection is to be found in the following U.S. patents:

| | | | |
|---|---|---|---|
| 3,518,449 | 6/1970 | Chung | 307/215 |
| 3,757,137 | 9/1973 | Ahmed | 307/235R |
| 3,879,576 | 4/1975 | Okada et al | 178/7.3 |
| 3,970,875 | 7/1976 | Leehan | 307/304 |

And in the published literature:
R. F. Althaus and L. S. Nagel "NIM Fast Logic Modules Utilizing MECL III Integrated Circuits" paper delivered at Nuclear Science Symposium Nov. 3–5, 1971, proceedings pages 520–525. Motorola Staff "MECL III Integrated Circuits" Book, 3rd Edition September 1973, pages 1–7 and 8.

Four of these patents specifically mention the tracking of transistors and/or diodes laid down in common fashion on a common semiconductor substrate, from which the same principle can be attributed to the remaining patents and publications since they deal with integrated circuitry.

The patent to Chung further arranges integrated logical components into two classes of circuit components each in its own portion with the semiconductor substrate, while the patent to Leehan, directed to field effect transistor circuitry, employs a sensing circuit for driving compensating circuitry connected to the overall logical circuitry.

The patent to Ahmed discloses strings of diode and transistor circuitry for developing compensating voltages due to variation, such as that due to ambient temperature, in a known ratio of currents and/or voltages and establishing a matched voltage reference circuit thereby.

The closest art appears to be disclosed in the patent to Okada et al some of the disclosure of which is also found in the two publications. Here a synchronizing signal separating circuit has some components arranged in a circuit configuration much like that of the applicant but without the features to be described hereinafter for effecting perfect tracking and/or compensation of the circuitry as ambient conditions vary.

SUMMARY OF THE INVENTION

The objects of the invention indirectly referred to hereinbefore and those that will appear as the specification progresses are attained in a simple logical signal level translating circuit comprising a transistor having emitter and base electrodes connected in an input circuit including an input resistor connected in series with the emitter-base current flow path of the transistor and having an output circuit comprising a load resistor connected in series with the output current flow path of the transistor. The reference potential circuit comprises a resistor, a pair of semiconductor diodes, and another resistor connected in series across a source of energizing potential. The load resistor is connected between the source and the collector electrode of the transistor, and the collector-base current flow path terminates at a point of reference potential common to the input and output circuits. The transistor and the diodes each have p-n junctions laid down in the chip in the same manner whereby the base-to-emitter ($V_{BE}$) voltages are substantially identical. The two resistors are of equal value whereby the junction between the two diodes is substantially one half of the energizing potential. If the transistor is connected in the common base configuration, which is preferable in the interest of better isolating the input and output circuits, the base electrode is connected to the more positive terminal of the diode connected to the more positive resistor in the reference circuit. Then the emitter electrode of the transistor, when conducting is at a potential equal to one half of the energizing potential. Preferably the load resistor is given a value of the same order of magnitude as other load resistors on the semiconductor chip. Then the value of the input resistor is adjusted to bring the potential at the output of the transistor to the proper lower signal value when a specified lower input signal voltage level is applied.

This condition prevails when the input signal is at the most positive allowable input down level and the amplifier output signal is at least as low as the most positive acceptable output down level. Connected and adjusted in this manner, the logical signal level translating circuitry will track substantially perfectly.

The potential at the one electrode of the transistor may be brought to a different value by differing values of resistance and VBE drops in the reference circuit. For example, the resistors may be in the ratio of 2:1 and two drops on the one hand as against one other in the suggested reference circuit. As a practical matter the drops are taken in integral multiples because of the nature of the semiconductor art. The resistances, however, may be trimmed as desired, though it will probably be more convenient to use integral multiples here as well.

DRAWING

In order that full advantage of the invention obtain in practice, the best mode embodiment thereof, given by way of example only, is described in detail hereinafter with reference to the accompanying drawing, forming a part of the specification, and in which.

DESCRIPTION

Figure 1:
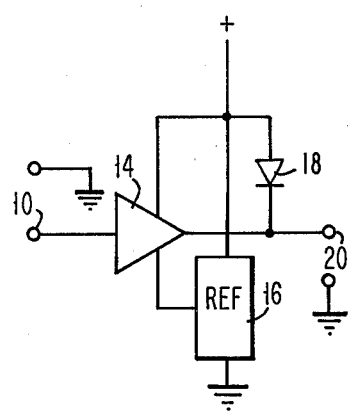
FIG. 1 is a functional diagram of electronic logical signal translating circuitry according to the invention.

FIG. 1 is a simplified functional diagram of high performance circuitry according to the invention. A logical electric signal is applied at input terminals 10 and translated in an amplifying circuit 14 operating in accordance with a reference potential circuit 16 for delivery to output terminals 20. It is contemplated that upper logical electric input signal levels of 1.6 to five volts and lower input signal levels of 0 to 0.96 volts be applied at the input terminals for producing logical signal levels differing by a half a volt or so. For example, an input logical levels of zero and plus 5 volts are translated to a logical signal expressed by levels of 2.5 and 3.0 volts.

Figure 2:
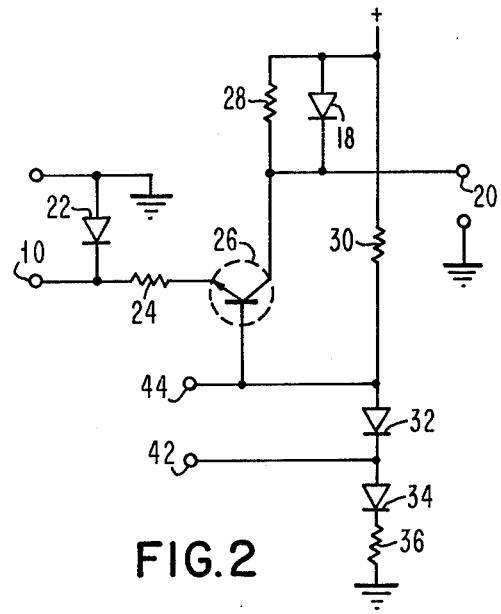
FIG. 2 is a schematic diagram of one embodiment of circuitry according to the invention.

FIG. 2 is a schematic diagram of one embodiment of circuitry according to the invention which is laid down, usually along with many others, on a single semiconductor chip. An input signal is applied at the input terminals 10 across which a semiconductor diode 22 is connected to clamp any negative voltage wave reflected from a conducting off-chip driving circuit. An input circuit resistor 24 is connected between the terminal 10 and the emitter electrode of a transistor 26. The collector electrode of the transistor 26 is connected to a load resistor 28 across which a semiconductor diode 18 is connected to prevent saturation of the transistor 26 at any higher current levels which may flow due to any excessively low input signal. The transistor 26 is connected in the common base configuration with the base electrode connected to the reference circuit 16. The latter comprises a series circuit comprising a resistor 30 two diodes 32, 34 and another resistor 36 connected between a point of positive energizing potential and a point of fixed reference potential shown here as ground. The collector electrode of the transistor 26 is connected to the output terminal 20 while the base electrode is connected to the reference circuit at the junction of the resistor 30 and the diode 32. Those skilled in the art will connect a transistor in a common emitter circuit in similar fashion, should they so desire, and of course, a p-n-p version may be used if the circumstance is such that the usual rules of interchange apply.

The reference network 16 holds the base of the transistor 26, which would otherwise be adversely affected by temperature and process variations, to a voltage level at which the input signal level required is relatively independent of these variations. The reference network 16 is of principal advantage in preventing interaction from signal by way of the emitter-base junction of the transistors 26 of a number of circuits according to the invention on the same semiconductor chip. The individual references 16 couple only to the receiver and the power supply bus, the latter of which can be suitably smoothed with suitable off-chip capacitors. The reference network contribution to variation in power bus load is only the reciprocal of beta $(1/\beta)$ of that contributed by the collector current flowing through the resistors 24 and 28.

There is a substantially exact solution for substantially perfect tracking the base-to-emitter voltage of the transistor 26 as will be shown. Aside from the small loading presented by the base of the transistor 26:

$$I_{36} = I_{30} = (V_{cc} - 2 \cdot V_{BE})/(R_{36} + R_{30})$$

where $I_{36}$ and $I_{30}$ is the current in the resistors 30, 36 in amperes;

$V_{cc}$ is the energizing potential applied in volts;

$V_{BE}$ is the base-to-emitter voltage of the transistor 26 of the diode 32 and of the diode 34; and $R_{30}$ and $R_{36}$ are the resistances of resistors 30, 36 in ohms. By design the nominal emitter-current density in the diodes 32 and 34 approximates the emitter-current density in the transistor 26 when it conducts a nominal logical current, so that the $V_{BE}$'s for these three devices are approximately equal.

$$V_b = 2 \cdot V_{BE} + I_{36} \cdot R_{36}$$

where $V_b$ is the voltage at the base of the transistor 26.

$$V_b = 2 \cdot V_{BE} + (V_{cc} - 2V_{BE}) \cdot R_{36}/(R_{36} + R_{30}) = V_{BE}(2 - 2 \cdot R_{36}/(R_{36} + R_{30})) + V_{cc} \cdot R_{36}/(R_{36} + R_{30}).$$

Then for perfect tracking let $$R_{30} = R_{36} \text{ and } V_{BE(32)} = V_{BE(34)} = V_{BE(26)};$$

and $$V_b = V_{BE} + V_{cc}/2$$

Although the embodiments of the circuit according to the invention as thus far discussed is based on a 2:1 ratio reference voltage, other ratios can be derived. For example, were a divider to employ three identical diodes and three identical resistors with the taps separating two diodes and one resistor from the other diode and resistors $$V_b = V_{BE} + V_{cc}/3 \text{ and } V_e = V_{cc}/3$$

As a practical matter, semiconductor fabrication limits the $V_{BE}$ drop to integral multiples of a given $V_{BE}$ for that particular chip. Normally the resistance values will also be chosen as integral multiples because of convenience where the $V_{BE}$ drops must be multiple and/or because in the master slice and like approaches of semiconductor fabrication a number of resistors with substantially equal resistance values will have been laid down. With laser trimming and the like processes available, however, different values of resistance are available within limits, if desired.

At this point $V_{BE}$ is tracking perfectly. The approximate voltage of the emitter of the transistor 26 when conducting is $V_{cc}/2$. This value of voltage is forced to be the correct reference voltage value by adjusting the value of the input resistor 24. In one practical application the load resistor 28 was chosen to be 2,000 ohms to match the load resistors used throughout the remainder of the logical circuitry on the semiconductor chip. In addition resistors 30 and 36 were given values of 3,000 ohms, which is small enough to reduce the base current of the transistor 26 to a negligible value. The value of the input resistor must bear a determinable ratio to the value of the load resistor. Out of a range of possible resistance values for the input resistor of 910 to 1760 ohms, the value of 1500 ohms was chosen for the input resistor. It should be remembered that the resistors 30 and 36 must track and the input resistor 24 must track with the load resistor 28 by the determinable ratio; but the exact values are otherwise flexible within a tolerance of plus or minus 25%. It is important only that the values vary together as set forth hereinabove.

Figure 3:
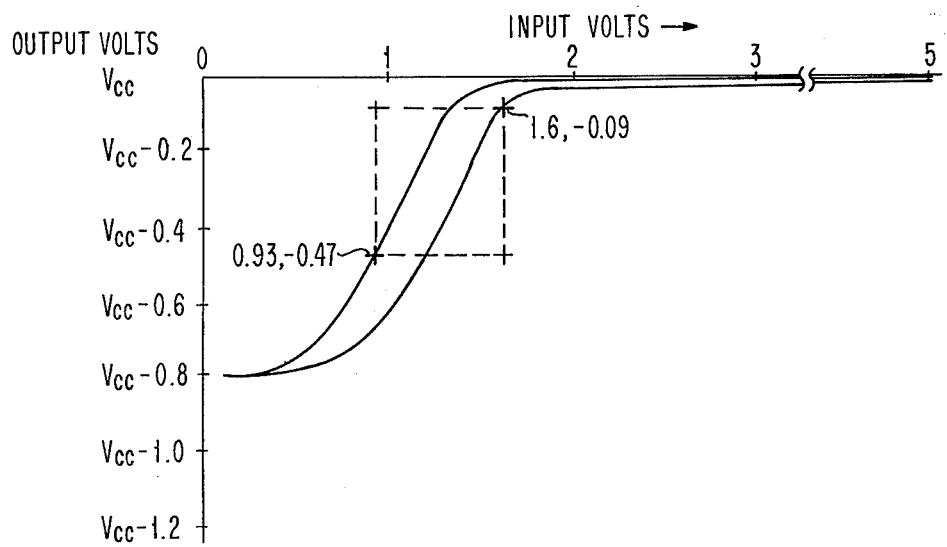
FIG. 3 is a graphical representation of an aspect of the manner in which an embodiment of the circuit according to the invention operates.

FIG. 3 is a graphical representation of a typical switching voltage characteristic of the circuit according to the invention. The output voltage $V_{OUT}$ is given with reference to the applied energizing voltage $V_{cc}$ as the voltage down from the latter. The input voltage is illustrated over a wide range about two bounding parameters of circuit operation. The desired operation is obtained on those points about the broken-line rectangle. Any relationship of input to output is suitable if the representative curve lies between the two shown in the broken rectangle. That is, proper curves must pass through the top and the bottom of the rectangle. This relationship obtains with the input resistor 24 having a value between 910 and 1760 ohms.

While the invention has been described in terms of an express embodiment and different component values suggested, it clearly should be understood that those skilled in the art will make changes as required for the application at hand without departing from the spirit and scope of the invention as defined in the appended claims concluding the specification.

The invention claimed is:

1. Electronic signal level translating circuitry, comprising
    a transistor having emitter, collector and base electrodes,
    an output circuit including a load resistor connected to the collector electrode of said transistor,
    an input circuit including an input resistor connected solely to but one of the other electrodes of said transistor,
    a reference potential regulating circuit including one terminal connected to a point of fixed energizing potential, one terminal connected to another of the electrodes of said transistor, and another terminal connected to a point of fixed reference potential,
    said reference circuit comprising at least two diodes and at least two resistors of equal value connected in series between said points of fixed potential with said other electrode of said transistor connected to the junction between one of said diodes and one of said resistors having one terminal thereof connected to said point of fixed energizing potential, and
    the p-n junctions of each of said diodes having the same characteristics as that of the emitter-base p-n junction of said transistor.

2. Electronic signal level translating circuitry as defined in claim 1 and wherein
    said input and said load resistors have values of resistance at which
    the potential at said one electrode is equal to the sum of one half said energizing potential applied and the base-to-emitter voltage drop of said transistor.

3. Electronic signal level translating circuitry as defined in claim 1 and incorporating
    a semiconductor diode connected across said input circuit.

4. Electronic signal level translating circuitry as defined in claim 1 and incorporating
    a semiconductor diode connected across said output circuit.

5. Electronic signal level translating circuitry as defined in claim 1, and wherein
    said circuitry having a given voltage gain,
    said input resistor and said load resistor are related in proportion to the voltage gain of said circuitry.

6. Electronic signal level translating circuitry as defined in claim 1, and wherein
    the potential at said other electrode is equal to the sum of the base-to-emitter voltage drop and one half of the applied energizing potential.

7. Electronic signal level translating circuitry, comprising
    signal input terminals,
    signal output terminals,
    a transistor having a collector, an emitter and a base electrode,
    an input resistor connected for direct current flow between one of said input terminals and said emitter electrode of said transistor only,
    a load resistor connected between a point of fixed energizing potential and in common with said collector electrode of said transistor and one of said output terminals,
    one resistor, a pair of semiconductor diodes and another resistor connected in series between said point of fixed energizing potential and a point of fixed reference potential for said input and output terminals and said energizing potential,
    said one and said other resistors having equal resistance values, and
    each of said diodes and the emitter-base junction of said transistor are of substantially the same characteristic structure, and
    said base electrode of said transistor being directly connected to the junction between said one resistor and the contiguous diode.

8. Electronic signal level translating circuitry as defined in claim 7, and incorporating
    a semiconductor diode interconnecting said signal input terminals for clamping excessive input signal.

9. Electronic signal level translating circuitry as defined in claim 7 and incorporating
    a semiconductor diode shunted across said load resistor for preventing saturation of said transistor on excessively low input signal.

10. Electronic signal level translating circuitry as defined in claim 7 and wherein
    said input and said load resistors have resistance values at which the potential at said base electrode is equal to the sum of the base-to-emitter drop of said transistor and one half the value of said energizing potential.

* * * * *

UNITED STATES PATENT OFFICE
CERTIFICATE OF CORRECTION

PATENT NO. : 4,194,135
DATED : March 18, 1980
INVENTOR(S) : Warren Allen Christopherson It is certified that error appears in the above-identified patent and that said Letters Patent are hereby corrected as shown below:

Column 4, line 26 should read as follows:

"$V_b = V_{BE} + V_{cc}/2$ and $V_e = V_{cc}/2$ which is independent of $V_{BE}$ and the resistor values."

Signed and Sealed this

Twenty-fourth Day of June 1980

[SEAL]

*Attest:*

SIDNEY A. DIAMOND

*Attesting Officer*     *Commissioner of Patents and Trademarks*